US011545601B2

(12) United States Patent
Hien

(10) Patent No.: US 11,545,601 B2
(45) Date of Patent: Jan. 3, 2023

(54) COMPONENT AND METHOD FOR PRODUCING A COMPONENT

(71) Applicant: OSRAM OLED GmbH, Regensburg (DE)

(72) Inventor: Matthias Hien, Kirchroth (DE)

(73) Assignee: OSRAM OLED GMBH, Regensburg (DE)

( * ) Notice: Subject to any disclaimer, the term of this patent is extended or adjusted under 35 U.S.C. 154(b) by 129 days.

(21) Appl. No.: 17/052,618

(22) PCT Filed: May 2, 2019

(86) PCT No.: PCT/EP2019/061224
§ 371 (c)(1),
(2) Date: Nov. 3, 2020

(87) PCT Pub. No.: WO2019/223977
PCT Pub. Date: Nov. 28, 2019

(65) Prior Publication Data
US 2021/0167259 A1    Jun. 3, 2021

(30) Foreign Application Priority Data
May 23, 2018  (DE) .......................... 102018112332.9

(51) Int. Cl.
*H01L 33/54*  (2010.01)
*H01L 33/48*  (2010.01)
(Continued)

(52) U.S. Cl.
CPC ............ *H01L 33/54* (2013.01); *H01L 33/486* (2013.01); *H01L 33/502* (2013.01); *H01L 33/60* (2013.01); *H01L 2933/005* (2013.01)

(58) Field of Classification Search
CPC ...... H01L 33/60; H01L 33/52; H01L 25/0753
See application file for complete search history.

(56) References Cited

U.S. PATENT DOCUMENTS 9,318,357 B2    4/2016  Brandl et al.
9,490,397 B2   11/2016  Preuß et al.
(Continued)

FOREIGN PATENT DOCUMENTS

DE    102012109905 A1    4/2014
DE    102012113003 A1    4/2014
(Continued)

*Primary Examiner* — Marcos D. Pizarro
*Assistant Examiner* — Antonio B Crite
(74) *Attorney, Agent, or Firm* — Slater Matsil, LLP

(57) ABSTRACT

In an embodiment a component includes at least two component parts configured to generate electromagnetic radiation, two encapsulations and a one-piece carrier frame having a plurality of openings, each opening in form of a through-hole, wherein the component parts are arranged in different openings such that a respective component part is laterally spaced apart from inner walls of an associated opening, wherein each component part is enclosed in lateral directions by one of the encapsulations such that the component parts are mechanically connected to the carrier frame via the encapsulations thereby forming a self-supporting and mechanically stable unit, wherein the carrier frame comprises a casting material, the casting material being a castable silicone, a resin or a plastic material, and wherein the two encapsulations arranged in the two openings of the carrier frame have different materials or different fluorescents.

20 Claims, 8 Drawing Sheets

(51) Int. Cl.
    *H01L 33/50*     (2010.01)
    *H01L 33/60*     (2010.01)
    *H01L 33/52*     (2010.01)
    *H01L 25/075*     (2006.01)

(56) References Cited

U.S. PATENT DOCUMENTS

| | | |
|---|---|---|
| 9,911,719 B2 | 3/2018 | Schwarz et al. |
| 10,615,323 B2 | 4/2020 | Kühnelt et al. |
| 2017/0263828 A1* | 9/2017 | Mao .................. H01L 33/502 |
| 2017/0263837 A1* | 9/2017 | Jeon .................. H01L 33/0095 |
| 2018/0076367 A1 | 3/2018 | Knoerr |
| 2019/0058095 A1* | 2/2019 | Choi .................. H01L 33/56 |

FOREIGN PATENT DOCUMENTS

| | | | |
|---|---|---|---|
| DE | 102014106791 A1 | 11/2015 | |
| DE | 102015105486 A1 | 10/2016 | |
| DE | 102015107660 A1 | 11/2016 | |
| DE | 102018104290 A1 | 8/2019 | |
| WO | WO-2012101488 A1 * | 8/2012 | ........... H01L 33/486 |
| WO | 2017037010 A1 | 3/2017 | |
| WO | 2017178332 A1 | 10/2017 | |

* cited by examiner

COMPONENT AND METHOD FOR PRODUCING A COMPONENT

This patent application is a national phase filing under section 371 of PCT/EP2019/061224, filed May 2, 2019, which claims the priority of German patent application 102018112332.9, filed May 23, 2018, each of which is incorporated herein by reference in its entirety.

TECHNICAL FIELD

A component, especially an optoelectronic component, is specified. Furthermore, a method for producing a component, in particular such a component, is specified.

BACKGROUND

A conventional component comprising a plurality of semiconductor chips usually has a carrier on which the semiconductor chips are arranged. An overall height of the component is thus determined by the vertical layer thickness of the carrier and the height of the semiconductor chips. Since such a component is usually mechanically stabilized by the carrier, the carrier should be sufficiently thick. However, this has a negative influence on the overall height of the component which should be kept as low as possible in electronics.

SUMMARY

Embodiments provide a component, in particular an optoelectronic component which is particularly compact and mechanically stable and at the same time has the lowest possible overall height. Other embodiments provide a reliable and cost-efficient method for producing a component, in particular a component described here.

These A component is provided.

According to at least one embodiment of the component, it has at least one component part, an encapsulation and a carrier frame. In particular, the component is free of a further carrier on which the component part, the encapsulation and/or the carrier frame are/is arranged. For example, the carrier frame has an opening in which the component part is arranged. In particular, the component part is enclosed by the encapsulation such that the component part is mechanically connected to the carrier frame via the encapsulation. Preferably, only the carrier frame, the encapsulation and the component part form a self-supporting and mechanically stable unit. In particular, the component is free of a lead frame, a ceramic carrier or a carrier in the form of a printed circuit board (German: Leiterplatte).

The encapsulation can be directly adjacent to the component part and/or to the carrier frame, as a result of which the component part is firmly mechanically connected to the carrier frame. The component has an overall height which is essentially defined by a vertical height of the carrier frame and/or of the encapsulation. For example, a ratio of the vertical height of the carrier frame or of the encapsulation to the total height of the component is between 0.8 and 1 inclusive, between 0.9 and 1 inclusive, for example between 0.95 and 1 inclusive or between 0.99 and 1 inclusive.

According to at least one embodiment of the component, the carrier frame has an opening in the form of a through-hole. In particular, the component part is arranged in the opening such that the component part is laterally spaced from inner walls of the opening. In top view, the component part and the carrier frame are preferably free of overlap. If the opening is a through-hole, the opening does not have a bottom surface formed by a surface of the carrier frame. In other words, the opening extends in the form of a through-hole along the vertical direction throughout the carrier frame. Thus the opening is a through-recess in the carrier frame. The carrier frame can have a plurality of such openings. The component can have a plurality of the component parts that are arranged in the openings of the carrier frame and, in particular, are mechanically connected to the carrier frame via the encapsulation or via a plurality of encapsulations.

A lateral direction is understood to mean a direction that is in particular parallel to a main extension surface of the component. For example, the component part is an optoelectronic component part that is configured to generate or detect electromagnetic radiation during operation. The component part can be a semiconductor chip, for example a light emitting diode (LED). In particular, the main extension surface of the component runs parallel to a radiation entrance surface or a radiation exit surface of the component part. A vertical direction is understood to mean a direction that is in particular perpendicular to the main extension surface of the component. The vertical direction and the lateral direction are for instance orthogonal to each other.

In at least one embodiment of the component, it has at least a component part, an encapsulation and a carrier frame. The carrier frame has an opening in the form of a through-hole, wherein the component part is arranged in the opening such that the component part is laterally spaced from the inner walls of the opening. In the lateral direction, the component part is enclosed by the encapsulation such that the component part is mechanically connected to the carrier frame via the encapsulation, as a result of which the carrier frame, the encapsulation and the component part form a self-supporting and mechanically stable unit.

In particular, the carrier frame is formed as a main carrier of the component. In other words, the component is mainly mechanically stabilized by the carrier frame. In particular, the component is free of a further carrier on which the carrier frame or the component part is arranged. It is possible that at least 80%, 90%, for instance at least 95% or at least 98% of the total vertical height of the component is accounted for by a vertical height of the carrier frame. It is possible that the encapsulation completely covers the component part in top view. For example, the encapsulation may completely fill the opening of the carrier frame. The encapsulation and the carrier frame may have for instance the same vertical height. In other words, the carrier frame and the encapsulation can have the same vertical thickness within the production tolerances.

It is also possible that the encapsulation only partially fills the opening of the carrier frame. In this case, the encapsulation may have a lower vertical height than the carrier frame. It is also possible that the encapsulation has a greater vertical height than the carrier frame. In the vertical direction, the encapsulation may protrude beyond the carrier frame. For example, the encapsulation has a surface which faces away from the component part and is at least partially curved, in particular convexly curved. The encapsulation can have the shape of a lens at least in places.

In at least one embodiment of the component, it has at least two component parts configured for generating electromagnetic radiation, two encapsulations and a carrier frame. The carrier frame is formed in one-piece and has a plurality of openings, each in the form of a through-hole, wherein the component parts are arranged in different openings such that the respective component part is laterally spaced from the inner walls of the associated opening. The component parts are each enclosed in lateral directions by one of the encapsulations such that the component parts are mechanically connected to the carrier frame via the encapsulations, as a result of which the carrier frame, the encapsulations and the component parts form a self-supporting and mechanically stable unit. In particular, the carrier frame is formed from a casting material, wherein the casting material is a castable silicone, resin or plastic material.

In the following, for reasons of simplicity, the component is described only in connection with one component part and one encapsulation. However, the component may have at least two or more component parts and at least two or more encapsulations, wherein the features described in connection with the one component part and with the one encapsulation may also be used for at least two or more component parts and for at least two or more encapsulations.

According to at least one embodiment of the component, the component or the carrier frame has a side surface having an indentation, wherein the indentation is visible in a plane view of a front side of the component and is formed to mark the position of a contact structure on the rear side of the component.

In accordance with at least one embodiment of the component, the side surfaces of the carrier frame are each formed to be oblique so that an inner separating wall and outer separating walls of the carrier frame have a cross-section that increases from a front side of the component towards the rear side of the component.

According to at least one embodiment of the component, the encapsulation is directly adjacent to the component part and/or directly to the carrier frame in the lateral directions. Preferably, the encapsulation is flush with the component part and/or with the carrier frame on a rear side of the component part and/or of the carrier frame. The component may have a contact surface, in particular a planar contact surface, which comprises the rear side of the component part, the rear side of the carrier frame and a rear side of the encapsulation. The contact surface of the component part thus delimits the encapsulation, the carrier frame and/or the component in a vertical direction.

According to at least one embodiment of the component, a ratio between a vertical height of the carrier frame and a vertical height of the encapsulation or encapsulations is between 0.8 and 1.2 inclusive, in particular between 0.9 and 1.1, particularly preferably between 0.95 and 1.05 inclusive. It is possible that the encapsulation and the carrier frame have the same vertical height. In particular in this case, the encapsulation is flush with the carrier frame both at the contact surface of the component and at a front side of the component. The encapsulation and the carrier frame have the same vertical height if the vertical layer thicknesses of the encapsulation and the carrier frame are equal within the production tolerances. In particular, if the encapsulation has the shape of a lens, the ratio between the vertical height of the carrier frame and the vertical height of the encapsulation may be between 0.5 and 1.5 inclusive, for instance between 0.6 and 1.4 inclusive or between 0.7 and 1.3 inclusive.

According to at least one embodiment of the component, the component part, the encapsulation and/or the carrier frame are flush with each other at a lateral contact surface. The lateral contact surface of the component is in particular a planar surface which is formed in places for instance by the rear side of the carrier frame, the rear side of the component part and/or the rear side of the encapsulation. On the rear side of the component part, the component part can have electrical contacts, for example two electrical contacts of different electrical polarities, which are provided for the electrical contacting of the component part.

The component part may have a front side which faces away from the rear side and is free of electrical contacts. In particular, the front side of the component part is a radiation passage surface, for instance a radiation exit surface or a radiation entry surface of the component part. In particular, the component part can only be electrically contacted on its rear side facing away from the encapsulation. The component part can be a semiconductor chip, in particular an optoelectronic semiconductor chip, for example with two electrical contacts on the rear side. Preferably, the component part is formed as a flip chip.

According to at least one embodiment of the component, it has a contact structure for external electrical contacting of the component part, the component parts or of the component. In particular, the contact structure is formed on the contact surface of the component. The contact structure can have a plurality of connection areas on the contact surface, wherein the connection areas of the contact structure can each be in electrical contact with at least one of the electrical contacts of the component part. The component has a rear side which may be formed in places by an exposed surface of the contact structure. In particular, the component can be electrically contacted exclusively via its rear side. The front side of the component is preferably free of any contact structures. The contact surface of the component may have regions that are not covered by the contact structure. These regions of the contact surface can be covered by a protective layer, especially by a radiation-reflecting protective layer. The protective layer, in particular the radiation-reflecting protective layer, may be formed on the contact surface of the component such that the rear side of the component is formed in places by an exposed surface of the radiation-reflecting protective layer. The protective layer is especially electrically insulating.

The protective layer may be directly adjacent to the contact structure, in particular to the connection areas of the contact structure. The radiation-reflecting protective layer may contain titanium oxide, especially titanium dioxide. It is possible that the rear side of the component is formed exclusively by exposed surfaces of the protective layer and of the contact structure. The protective layer and the contact structure may have the same or different layer thicknesses. In particular, a maximum of 20%, 10%, 5%, 3%, 2%, 1% or 0.5% of the total vertical height of the component is accounted for by the layer thickness of the contact structure and/or of the protective layer.

According to at least one embodiment of the component, the component and/or the carrier frame have/has a side surface comprising an indentation. Preferably, the indentation is visible in top view on a front side of the component and/or of the carrier frame, i.e. in top view it is visible from outside for an external observer. The indentation is especially formed to mark the position of the contact structure, in particular to mark the position of a connection area of the contact structure, on the rear side of the component. In a plane view of the front side of the component, even if the connection area of the contact structure is covered, in particular completely covered, by the carrier frame, the encapsulation and/or by the component part, the position of the connection area can still be located by the position of the indentation from the front side of the component. This simplifies the montage of a component described here, for example on a printed circuit board. The component can have a number of indentations on its side surface or on its side surfaces.

According to at least one embodiment of the component, the encapsulation is made from a radiation-transmissive material. In a plane view of the front side of the component, the encapsulation can completely cover the component part. For example, the encapsulation is formed from a material having a transmittance of at least 60%, 70%, 80% or at least 90% for visible light or for electromagnetic radiation with a peak wavelength for instance between 400 nm and 800 nm inclusive.

It is possible that fluorescents for light conversion, for example in the form of fluorescent particles, are embedded in the radiation-transmissive material. For example, the encapsulation has a radiation-transmissive material with embedded fluorescent particles for light conversion, wherein the fluorescent particles are configured to convert UV radiation and/or electromagnetic radiation in the blue spectral range into electromagnetic radiation in the green, yellow or red spectral range. In particular, the encapsulation has a transmittance of less than 40%, 30%, 20% or less than 10% for electromagnetic radiation in the blue and/or ultraviolet spectral range.

It is possible that the encapsulation is made exclusively of a transparent material which is especially free of fluorescent particles. In this case, the encapsulation can only be formed as a transparent protective layer for the underlying component part. However, it is conceivable that scattered particles are embedded in the radiation-transmissive material, in particular in the transparent material of the encapsulation.

According to at least one embodiment of the component, the carrier frame is made of a material that has a higher material hardness than a material of the encapsulation. The carrier frame can be made of an electrically insulating material. In particular, the carrier frame is made of a casting material. For example, the casting material is a castable silicone, resin or plastic material.

According to at least one embodiment of the component, it has a plurality of the component parts and/or a plurality of encapsulations. In particular, the carrier frame is formed as one-piece. The carrier frame can have at least one or a plurality of openings, each in the form of a through-hole. The component parts are located for instance in the openings of the carrier frame and are in particular completely enclosed in the lateral directions by the encapsulations, as a result of which the component parts are mechanically connected to the carrier frame via the encapsulations.

It is possible that several component parts are arranged in a common opening of the carrier frame. Furthermore, it is possible that the component parts are arranged in different openings of the carrier frame. It is also possible that a single component part is arranged in each opening of the carrier frame. The encapsulations can be arranged in different openings of the carrier frame. Thus, the encapsulations can be formed separately from each other. For example, separate encapsulations are arranged in separate openings of the carrier frame. Each component part can be uniquely assigned to an encapsulation and/or to an opening, and vice versa. It is possible that the encapsulations have different material compositions. For example, the encapsulations in different openings have different fluorescent materials. However, it is also possible that the encapsulations have the same material composition.

According to at least one embodiment of the component, it has at least two component parts and at least two encapsulations. The two component parts can be arranged in two different openings of the carrier frame. In particular, the two component parts are each enclosed by one of the two encapsulations. Preferably, the two component parts are configured to generate electromagnetic radiation. The two encapsulations can be arranged separately in two different openings of the carrier frame. In particular, the encapsulations have different fluorescents. Even if the component parts are similarly designed in different openings, electromagnetic radiation of the same peak wavelength can be converted into electromagnetic radiation of different longer peak wavelengths by the different fluorescents in the encapsulations.

Deviating from this, it is also possible that the component has for instance three component parts, at least four component parts or a higher number of the component parts in several openings of the carrier frame. In top view of the component, the component parts, the encapsulations and/or the openings can be arranged in a matrix-like way, i.e. in rows and columns. Due to the contact structure, the component parts can be arranged such that they can be individually electrically activated. The component parts in the different openings can be covered by the encapsulations of the same or different material compositions. The individual control of the component parts allows the component to emit light of a desired color and/or intensity during operation.

The component parts, the encapsulations and the openings of the carrier frame can each be formed analogous to each other. The features described in connection with a single component part, with a single encapsulation or with a single opening can therefore also be used for the plurality of the component parts, the encapsulations or the openings. If the component has a plurality of the component parts and encapsulations, it is still possible to achieve, for example, that the rear sides of the component parts and/or of the encapsulations are flush with the rear side of the carrier frame, especially with the rear side of the common carrier frame, at the contact surface of the component.

In at least one embodiment of a method for producing a component, an auxiliary carrier is provided. A carrier frame is formed or arranged on the auxiliary carrier, wherein the carrier frame has at least one or a plurality of openings each in the form of a through-hole. A component part or a plurality of the component parts is/are arranged in the opening or in the openings on the auxiliary carrier. In particular, the component part is laterally spaced from the inner walls of the associated opening. An encapsulation or a plurality of encapsulations is/are formed in the opening or in the plurality of openings so that the component part is enclosed in the lateral directions by the associated encapsulation such that the component part is mechanically connected to the carrier frame via the encapsulation. In a subsequent method step, the auxiliary carrier is removed.

Directly or indirectly after the removal of the auxiliary carrier, rear sides of the carrier frame, the encapsulation or encapsulations and/or the component part or component parts are exposed. In particular, the component part or the plurality of the component parts has/have rear side electrical contacts which are freely accessible after removal of the auxiliary carrier. The surface exposed after removal of the auxiliary carrier forms in particular a contact surface of the component. If a surface of the auxiliary carrier, which faces the carrier frame, is planar, the contact surface can already be planar after removal of the auxiliary carrier without further processing. The planar contact surface is formed by the exposed rear sides of the carrier frame, the encapsulations and/or of the component parts.

According to at least one embodiment of the method, the auxiliary carrier has a base body, in particular a metallic base body. The auxiliary carrier may have an adhesive layer which is arranged on the base body. Preferably, the adhesive layer has an exposed adhesive surface. In particular, the adhesive layer is a thermally dissolvable adhesive film arranged on the base body. Prior to the formation of the encapsulation or encapsulations, the component part or the plurality of the component parts can be bonded to the adhesive film, especially within the opening or openings of the carrier frame. After the formation of the encapsulation or encapsulations, the auxiliary carrier can be removed from the carrier frame in particular by heating the adhesive layer, especially the adhesive film. The use of a thermally dissolvable layer, especially a thermally dissolvable adhesive film, proves to be particularly suitable for removing the auxiliary carrier, since the adhesive layer, especially in the form of the thermally dissolvable adhesive film, can be dissolved again when heated. There is therefore no risk of the component parts being damaged during the separation process of the auxiliary carrier. Furthermore, no post-processing steps are necessary, for example for planarizing the contact surface.

According to at least one embodiment of the method, the carrier frame is produced separately and is bonded to the auxiliary carrier. Alternatively, it is possible that the carrier frame is formed directly on the auxiliary carrier. For example, the carrier frame can be applied to the adhesive layer in a structured manner.

A casting process is particularly suitable for the production of the carrier frame. A casting process is generally understood to mean a process by which a molding compound can be shaped in accordance with a specified form and, if necessary, cured, preferably under the action of pressure. In particular, the term "casting process" includes at least molding, injection molding, transfer molding and compression molding. The carrier frame may be made of an electrically insulating molding material, for example of a plastic, for instance a castable polymer such as resin, epoxy or silicone. For example, the carrier frame is produced by injection molding.

After forming or arranging the carrier frame, the component parts are applied, in particular, directly to the adhesive layer or to the thermally dissolvable adhesive film. Apart from the adhesive layer, no additional connecting material is required. The component parts can be pressed onto the adhesive layer or the adhesive film. This alone allows the positions of the component parts to be fixed on the adhesive layer. The component parts can be arranged by a so-called pick and place process. The openings of the carrier frame having the component parts arranged therein can be filled with a material of the encapsulation, for example by an injection process. Due to the adhesion of the component parts to the adhesive layer, it can be avoided that the positions of the component parts in the openings are shifted during the formation of the encapsulations.

After removing the auxiliary carrier, a contact structure and/or a protective layer can be formed on the contact surface of the component. In particular, the contact structure is applied to the contact surface prior to the application of the protective layer. The contact structure can have a plurality of connection areas, wherein each of the connection areas can cover a single contact of one component part or a plurality of contacts of several component parts. Those regions of the contact surface which are not covered by the contact structure can be covered with a protective layer, especially with a radiation reflecting protective layer.

In particular, the contact structure is formed as a planar contact structure. The planar contact structure is located particularly directly on the contact surface and preferably does not show any local elevations. The connection areas of the contact structure can have for instance the same vertical layer thickness. Such a contact structure can have a very small layer thickness so that the overall height of the component is hardly influenced by the contact structure and/or the protective layer.

For example, the contact structure and/or the protective layer have/has a vertical layer thickness which is in particular less than 30 µm, 20 µm, 10 µm, 2 µm, less than 1 µm, in particular less than 500 nm or less than 300 nm. Such a vertical layer thickness of the protective layer and/or of the contact structure is preferably between 100 nm and 1 µm inclusive. It is possible that the protective layer and the contact structure have the same average vertical layer thickness within the manufacturing tolerances. It is conceivable that the protective layer has a greater vertical layer thickness than the contact structure, or vice versa. The planar contact structure can be formed by a galvanic process. It is possible that the planar contact structure is formed as a nano-layer which in particular has a vertical layer thickness between 3 nm and 1 µm inclusive, for instance between 10 nm and 500 nm inclusive, for example between 10 nm and 100 µm inclusive.

In at least one embodiment of a method for producing a component, an auxiliary carrier is provided. A carrier frame is formed on the auxiliary carrier, wherein the carrier frame has at least two openings, each in the form of a through-hole. The carrier frame is preferably formed directly on the auxiliary carrier using a casting process, wherein the carrier frame is formed for instance from a casting material which is a castable silicone, resin or plastic material. At least two component parts are arranged in the openings on the auxiliary carrier such that the component parts are laterally spaced from the inner walls of the corresponding opening. At least two encapsulations are formed in the openings so that the component parts are enclosed in lateral directions by the associated encapsulation such that the component parts are mechanically connected to the carrier frame by the encapsulations. The auxiliary carrier can then be removed.

The method described here for producing a component is particularly suitable for the production of a component described here with one component part, at least two component parts or several component parts. The features described in connection with the component can therefore also be used for the method and vice versa.

BRIEF DESCRIPTION OF THE DRAWINGS

Further preferred embodiments and further developments of the component as well as of the method will become apparent from the exemplary embodiments explained below in conjunction with FIGS. 1A to 9.

DETAILED DESCRIPTION OF ILLUSTRATIVE EMBODIMENTS

Figure 1A:
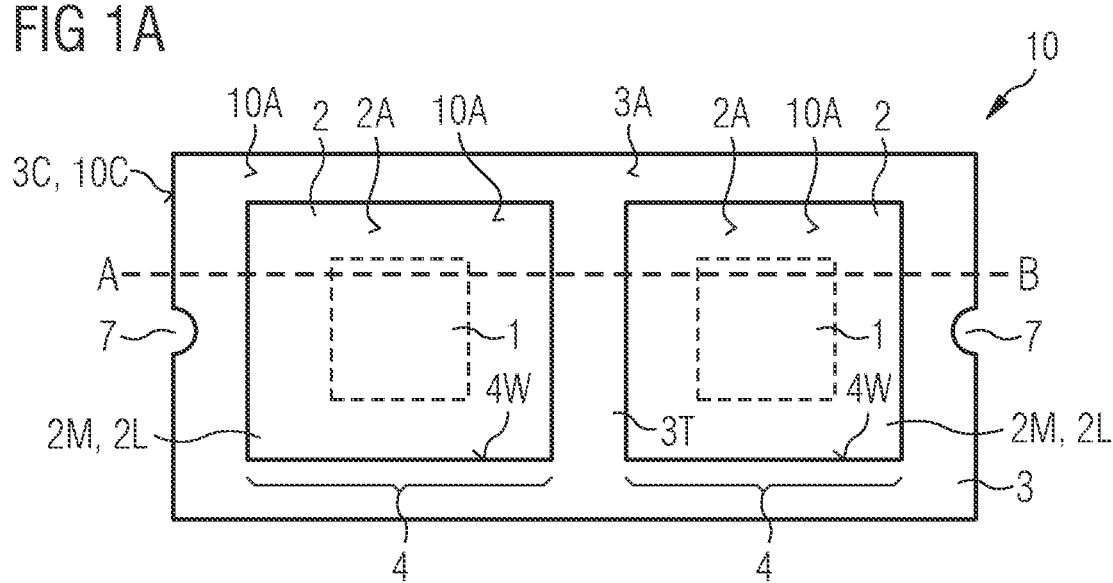
FIGS. 1A, 1B and 1C show schematic illustrations of a component in top view of a front side, in sectional view and in top view of a rear side of the component.

Identical, equivalent or equivalently acting elements are indicated with the same reference numerals in the figures.

The figures are schematic illustrations and thus not necessarily true to scale. Comparatively small elements and particularly layer thicknesses can rather be illustrated exaggeratedly large for the purpose of better clarification.

Figure 1B:
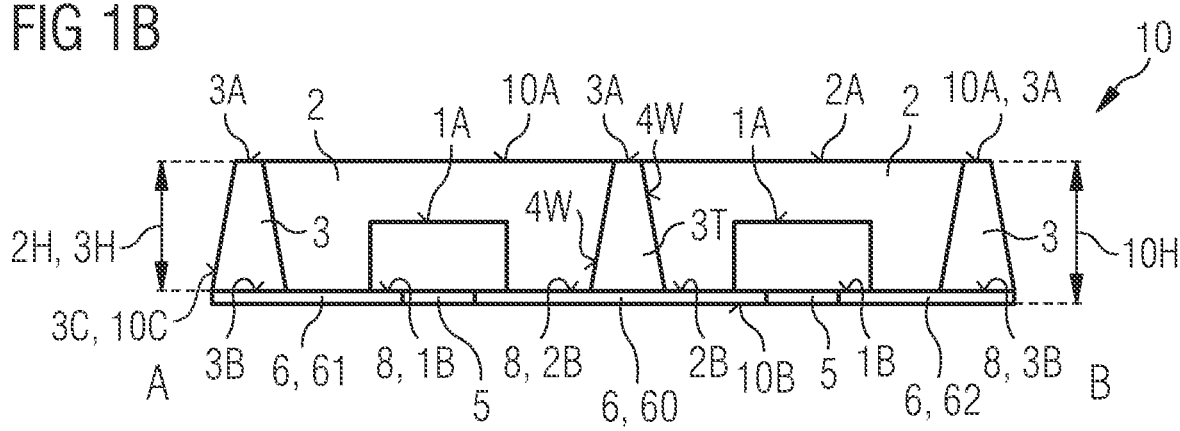
Figure 1C:
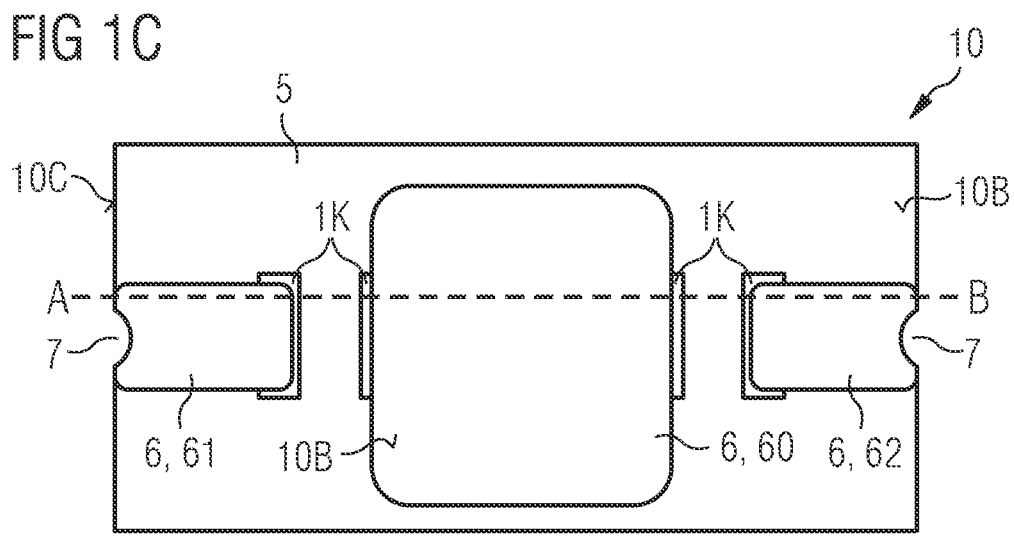

FIG. 1A schematically shows a component 10 in top view of its front side 10A. In FIG. 1B, such a component 10 is schematically represented by a section line AB in sectional view. In addition, FIG. 1C shows a schematic view of the rear side 10B of the component 10 in top view.

According to FIG. 1A, the component 10 has a carrier frame 3. The carrier frame 3 has an exposed front side 3A, wherein the front side 10A of the component 10 is partially formed by the front side 3A of the carrier frame 3. The carrier frame 3 has a plurality of openings 4. In each of the openings 4 at least one component part 1 is arranged. The component part 1 is laterally spaced from the side walls 4W of the corresponding opening 4. In a plane view, the component part 1 is completely covered by an encapsulation 2. The encapsulation 2 has a front side 2A, wherein the front side 10A of the component 10 can be formed by the front side 2A in places. The encapsulation 2 can be made of a radiation-transmissive, especially transparent material 2M. It is possible that fluorescents 2L are embedded in the material 2M, for example in the form of fluorescent particles 2L. However, it is possible that the encapsulation 2 is free of such fluorescents or fluorescent particles 2L.

According to FIG. 1A, the carrier frame 3 has two openings 4 arranged side by side. The openings 4 are separated by a separating wall 3T of the carrier frame 3. The encapsulations 2 in the two adjacent openings 4 are also separated by the separating wall 3T. It is possible that the encapsulations 2 in the different openings 4 have different materials 2M and/or different fluorescents 2L. The encapsulations 2 can have the same matrix material 2M, wherein in different encapsulations different fluorescents 2L are embedded in the matrix material.

For example, the encapsulation 2 has in a first opening 4 fluorescents 2L, which are configured to convert electromagnetic radiation for instance in the blue or ultraviolet spectral range to electromagnetic radiation in the green spectral range, while in a second opening 4, the encapsulation 2 has fluorescents 2L which are configured to convert electromagnetic radiation for instance in the blue or ultraviolet spectral range to electromagnetic radiation in the yellow or red spectral range. The component parts 1 in the different openings 4 can have the same design. For example, the component parts 1 are configured to generate electromagnetic radiation in the blue and/or ultraviolet spectral range. It is possible that the component parts 1 in different openings 4 are formed differently.

As shown in FIG. 1B, the opening 4 is formed as a through-hole through the carrier frame 3. The opening 4 can be completely filled by the encapsulation 2. In particular, a rear side 2B of the encapsulation 2 is flush with a rear side 3B of the carrier frame 3. It is possible that on a contact surface 8, the rear side 2B of one encapsulation 2 or of all rear sides 2B of all encapsulations 2 is/are flush with the rear side 3B of the carrier frame 3 and/or with a rear side 1B of the component part 1 or with all rear sides 1B of the component parts 1. On the front side 10A of the component 10, the front side 3A of the carrier frame 3 can be flush with a front side 2A of the encapsulation 2 or with all front sides 2A of the encapsulations 2.

The carrier frame 3 has a vertical height 3H which is in particular of the same height as a vertical height 2H of the encapsulation 2 or of the encapsulations 2. In deviation from FIG. 1B, it is possible that the carrier frame 3 has a greater height 3H than the height 2H of the encapsulation 2 or of the encapsulations 2. It is also possible that the height/s 2H of the encapsulations 2 or of the encapsulations 2 is/are greater than the height 2H of the carrier frame 2. For example, the encapsulation/s 2 is/are formed as a lens in places.

According to FIG. 1B, the opening 4 has the shape of a trapezoid in sectional view. Along the vertical direction from the front side 3A towards the rear side 3B, the opening 4 has a decreasing cross section. As shown in FIG. 1B, the inner separating wall 3T and the outer separating walls of the carrier frame 3 have an increasing cross-section from the front side 3A towards the rear side 3B.

With the front side 3A or with the rear side 3B of the carrier frame 3, the inner walls 4W of the openings 4 can each form an acute angle between 10° and 80° inclusive, for instance between 20° and 70° inclusive, for example between 30° and 60° inclusive, or an obtuse angle between 100° and 170° inclusive, for instance between 110° and 160° inclusive, for example between 120° and 150° inclusive. In other words, the inner walls 4W are formed in an oblique manner. This geometry of the openings 4 allows better control of the filling of the openings 4, in particular the adjustment of the vertical height 2H of the encapsulation 2. Furthermore, it allows to increase a radiation exit surface or a radiation entrance surface of the component 10 which is formed in particular by the front sides 2A of the encapsulations 2.

According to FIG. 1B, the component 10 has a contact surface 8 which is formed in particular by the rear sides 1B, 2B and 3B of the component parts 1, the encapsulations 2 and of the carrier frame 3. In particular, the contact surface 8 is a planar surface. At the contact surface 8, the contacts 1K of the component parts 1 are especially accessible. In particular, the component parts 1 have electrical contacts 1K exclusively on the rear sides 1B. The component part 1 or the component parts 1 can have a front side 1A facing away from the rear sides 1B which is formed as a radiation entrance surface or radiation exit surface of the component part 1. The front side 1A and all side surfaces of the component part 1 can be free of electrical contacts 1K. The front side 1A and all side surfaces of the component part 1 are completely covered, in particular by the associated encapsulation 2. The rear side 1B of the component part 1 is especially free of material of the encapsulation 2.

The component 10 has a contact structure 6 at the contact surface 8. The contact structure 6 has a plurality of connection areas 60, 61 and 62 shown for instance in FIG. 1C. In particular, the contact structure 6 is formed as a planar contact structure. The connection areas 61 and 62 can each cover one, in particular a single, contact 1K of a component part 1. For example, the connection area 61 in FIG. 1C is in direct electrical contact with a contact 1K of a first electrical polarity of a first component part 1. The further connection area 62 can be in direct electrical contact with a contact 1K of a first electrical polarity of a second component part 1. In a plane view, the connection area 61 and the other connection area 62 can each cover one of the contacts 1K.

As shown in FIG. 1C, the connection area 60 is formed in particular as a common connection area for the contacts 1K of a second electrical polarity of several component parts 1. In a plane view of the rear side 10B of the component 10, the common connection area 60 can cover two or more contacts 1K of the same electrical polarity of the component parts 1. The common connection area 60 can be formed as a common anode or as a common cathode of the component parts 1. The component parts 1 can still be electrically contacted individually via the connection area 61 and the other connection area 62. In other words, the component parts 1 can be individually activated by the connection areas 61 and 62. In contrast, it is possible that the contact structure 6 is free of such common connection area 60 and only has individual connection areas 61 and 62.

According to FIGS. 1A and 1C, the carrier frame 3 has a side surface 3C comprising at least one indentation 7. The side surface 3C of the carrier frame 3 forms in particular a side surface C of the component 10. In a plane view of the front side surface 10A of the component 10, the indentation 7 is visible to an external observer. In particular, the connection area 61 or the further connection area 62 on the rear side 10B of the component 10 is formed at the indentation 7. The indentation 7 thus serves to mark the position of the connection area 61 or 62 on the rear side 10B of the component 10. In a plane view of the front side 10, the contact structure 6 may be completely covered by the carrier frame 3 and the encapsulations 2.

In FIGS. 1A and 1B, the component 2 has several indentations 7, wherein the indentations 7 are formed on side surfaces 3C or 10C and are provided for marking the connection areas 61 and 62. In particular, the marked connection areas 61 and 62 are formed for individual electrical contacting of the component parts 1. In a plane view of the front side 3A, the connection areas, in particular all connection areas 60, 61 and 62 can be completely covered by the carrier frame 3 and by the encapsulations 2.

In contrast to FIGS. 1A, 1B and 1C, the component 10 can have more than two openings 4 and/or more than two component parts 1. Depending on the number of the openings 4 and/or of the component part 1, the component 10 can have the corresponding number of indentations 7. It is possible that the indentation 7 extends along the vertical direction from the rear side 10B as far as the front side 10A of the component 10. According to FIG. 1C, the side surfaces 3C of the carrier frame 3 or of the side surfaces 10C of the component 10 can each be oblique. In this case, to be visible in a plane view of the front side 10A, it is not necessary for the indentation 7 to extend from the rear side 10B as far as the front side 10A of the component 10. If the side surfaces 10C are oblique and form an inner acute angle with the contact surface 8 or with the rear side 10B of the component 10, the indentations 7 are already visible in a plane view of the front side 10A if the indentations 7 are formed exclusively in the area of the rear side 3B of the carrier frame 3.

According to FIGS. 1B and 1C, those areas of the contact surface 8 that are not covered by the contact structure 6 are covered by a protective layer 5. In particular, the protective layer 5 is reflective to radiation. For example, the protective layer 5 comprises radiation-reflecting particles made of titanium dioxide, for example. The protective layer 5 is especially electrically insulating. Preferably, the radiation-reflecting protective layer 5 has a reflectance of at least 60%, 70%, 80% or at least 90% for electromagnetic radiation in the visible spectral range.

According to FIG. 1B, the component 10 has a vertical height 10H, wherein the vertical height 10H defines the overall height of the component 10. In particular, the vertical height 10H is given essentially by the vertical height 2H or 3H of the encapsulation 2 or of the carrier frame 3. In particular, at least 80%, 90%, for example at least 95% or 98% of the vertical height 10H, i.e. the total height 10H, of the component 10 is given by the vertical height 2H of the encapsulations 2 and/or by the vertical height 3H of the carrier frame 3. The protective layer 5 and/or the contact structure 6 are/is formed, in particular with regard to their material composition and/or layer thickness, such that the protective layer 5 and/or the contact structure 6 are/is not formed as a carrier layer for the component 10 or the component parts 1. Without the carrier frame 3 and/or the encapsulations 2, the component parts 1, the protective layer 5 and the contact structure 6 would not form a mechanically stable unit.

Figure 2A:
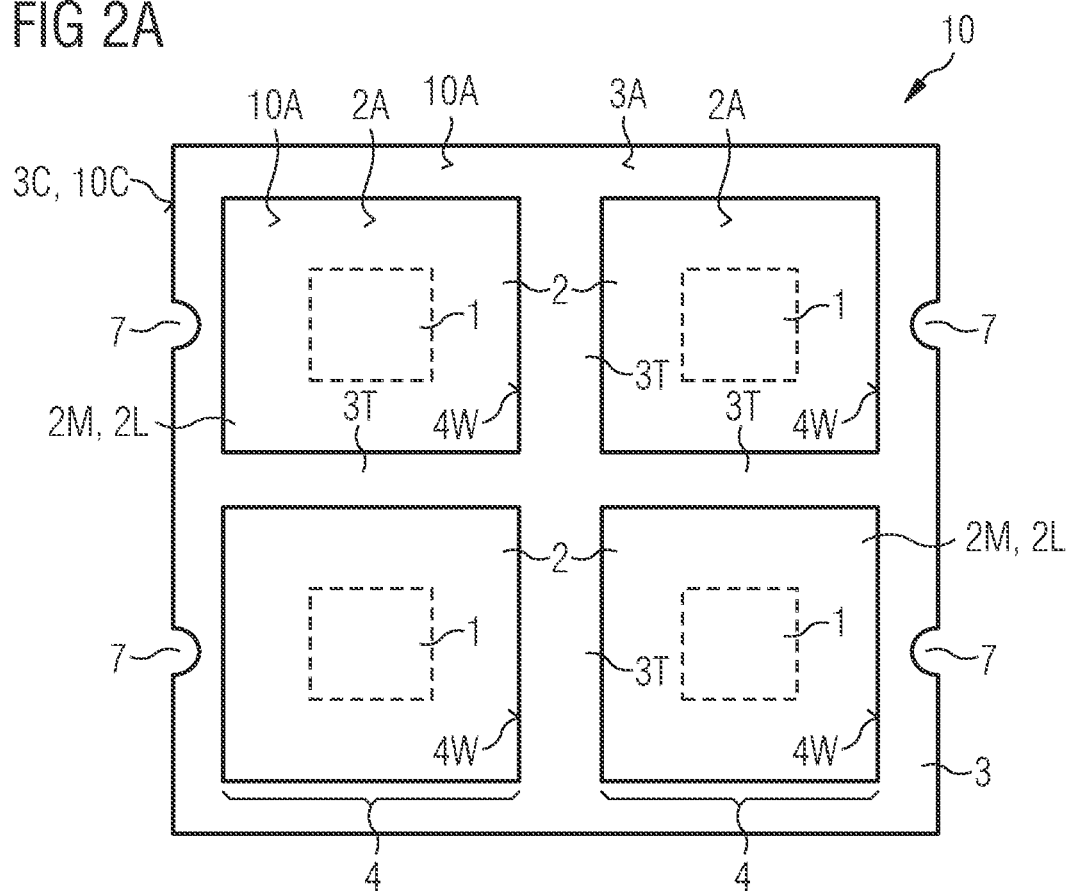
FIGS. 2A and 2B show schematic illustrations of another exemplary embodiment of a component in a plane view of the front side and rear side of the component.

The exemplary embodiment of a component 10 shown in FIG. 2A essentially corresponds to the exemplary embodiment of a component 10 shown in FIG. 1A. In contrast, the carrier frame 3 has four openings 4 each in the form of a through-hole. In contrast to FIG. 2A, the number of openings 4 of the component part 1, of the encapsulations 2 and/or of the indentations 7 can be different from four. The number of the openings 4, the number of the component parts 1, the number of the encapsulations 2 and/or the number of the indentations 7 may be equal. It is possible that the component 10 is configured to generate mixed light, e.g. white light. The encapsulations 2 in the different openings 4 can have different fluorescents 2L and/or different fluorescent particles 2L. For example, together with the corresponding encapsulations 2, the component parts 1 arranged in the three or four different openings 4 form an RGB or CMYK color system. Via the contact structure 6, which comprises for example several individual connection areas 61, 62, 63 and 64 and is shown in FIG. 2B, the component parts 1 can be individually actuated.

Figure 2B:
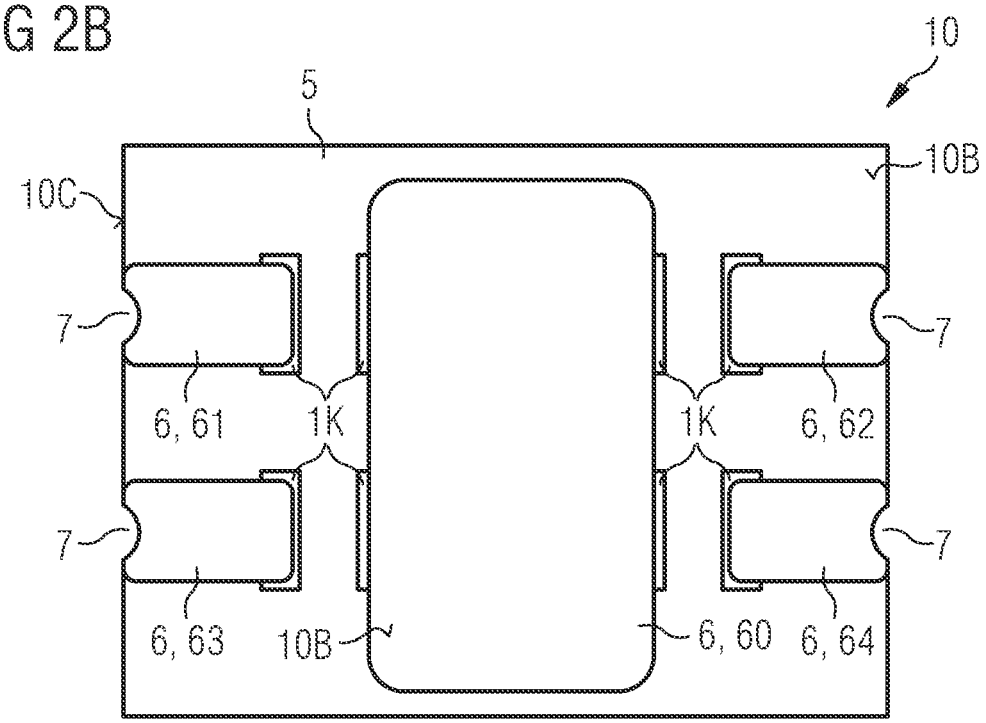

The exemplary embodiment shown in FIG. 2B essentially corresponds to the exemplary embodiment of a component 10 shown in FIG. 1C. In contrast, the contact structure 6 has four connection areas 61, 62, 63 and 64 for individual electrical contacting of the four component parts 1 shown in FIG. 2A. The contact structure 6 also has a common connection area 60. The common connection area 60 can be in electrical contact with the electrical contacts 1K of different component parts 1 at the same time. In particular, the connection areas 61, 62, 63 and 64 are each electrically connected to a single contact 1K of the component part 1.

The positions of the individual contact surfaces 61 to 64 can be marked by the positions of the indentations 7 on the side surfaces 10C of the component 10. Deviating from FIG. 2B, it is possible that the common connection area 60 extends to an edge area of the rear side 10B. In this edge area, the position of the common connection area 60 can be marked by a further indentation 7. The further indentation 7 can have a different geometry compared to the other indentations 7.

FIGS. 3A, 3B, 4A, 4B, 5A, 5B, 6A, 6B, 7A, 7B and 7C schematically illustrate various method steps of a method for the production of a component 10.

Figure 3A:
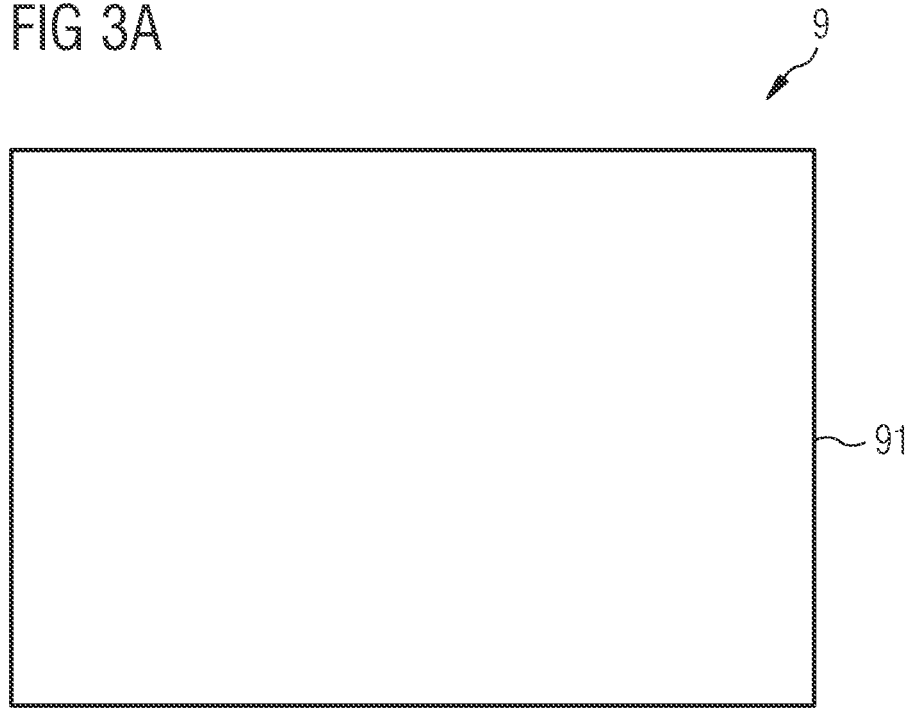
FIGS. 3A, 3B, 4A, 4B, 5A, 5B, 6A, 6B, 7A, 7B and 7C show schematic illustrations of various method steps of a method for producing a component.
Figure 3B:

According to FIGS. 3A and 3B, an auxiliary carrier 9 is provided. The auxiliary carrier 9 can have a base body 90. In particular, the base body 90 is metallic. For example, the base body 90 is metallic. The auxiliary carrier 9 has an adhesive layer 91 which is arranged on the base body 90. The adhesive layer 91 has an adhesive surface facing away from the base body 90 for receiving and/or temporarily fixing the carrier frame 3 and/or the component parts 1. In particular, adhesive layer 91 is an adhesive film, especially a thermally dissolvable adhesive film.

Figure 4A:
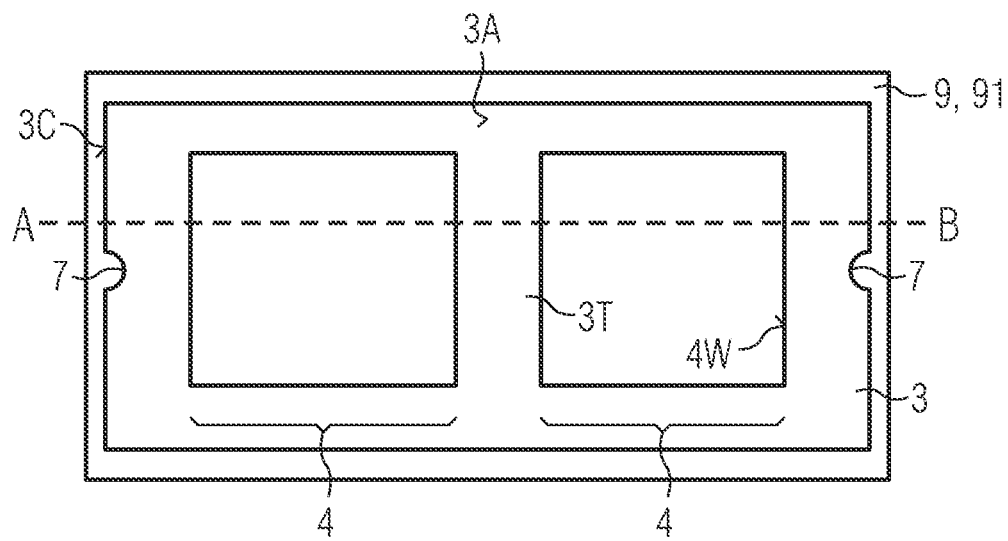
Figure 4B:
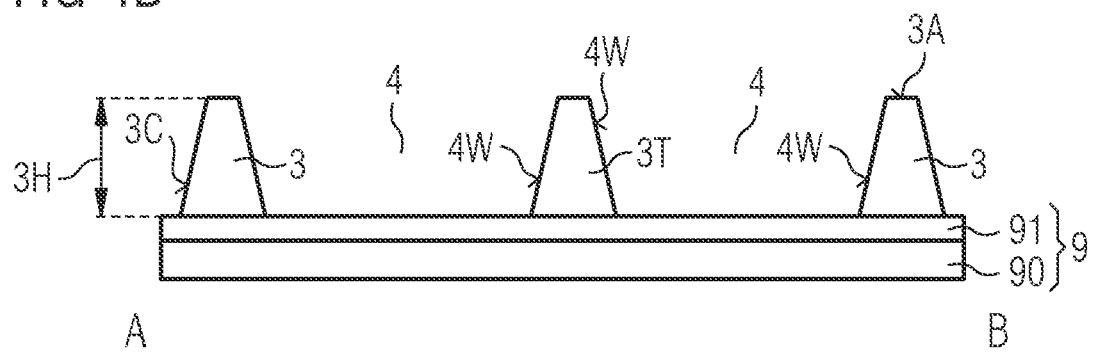

According to FIG. 4A, a carrier frame 3 is formed or arranged on the adhesive layer 61 or on the auxiliary carrier 9. The carrier frame 3 can be formed directly on the auxiliary carrier 9. Alternatively, the carrier frame 3 can be produced separately and glued to adhesive layer 91. The carrier frame 3 has a plurality of openings 4. In particular, the openings 4 are each formed as through-holes throughout the carrier frame 3. The bottom surfaces of the openings 4 are formed according to FIG. 4A by surfaces of the auxiliary carrier 9, in particular by surfaces of the adhesive layer 91. In particular, the carrier frame 3 is formed in one-piece. FIG. 4B schematically shows the carrier frame 3 in sectional view along the section line AB.

Figure 5A:
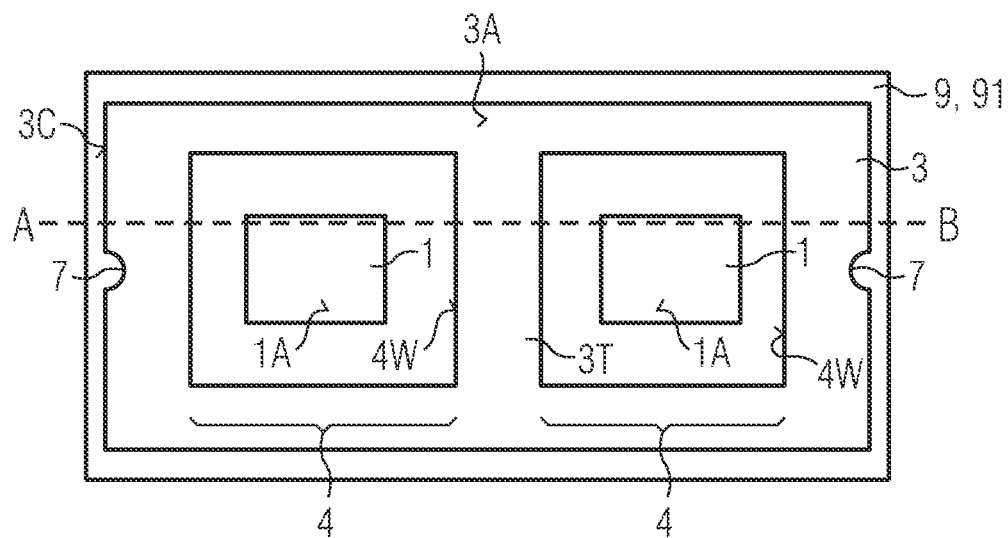
Figure 5B:
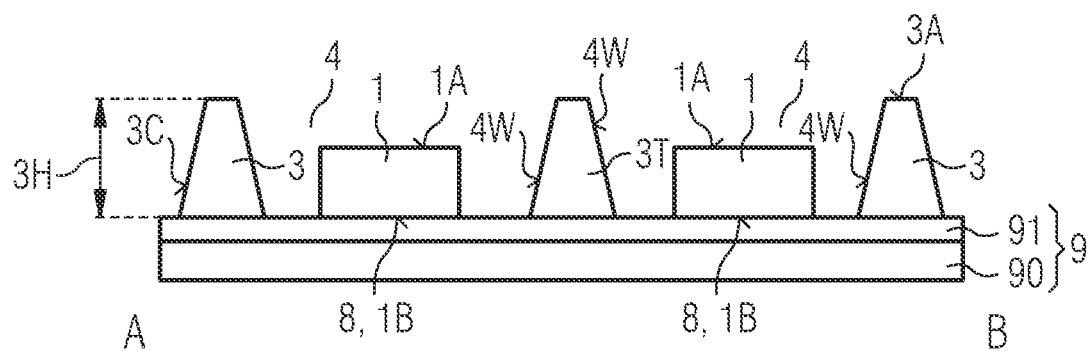

According to FIG. 5B, the component parts 1 are placed in the openings 4 of the carrier frame 3. In particular, the component parts 1 are glued to adhesive layer 91. The component parts 1 can be arranged centrally in the respective opening 4. In the lateral directions, the component part 1 is spaced apart from the side walls 4W of the corresponding opening 4. The component parts 1 are arranged in the openings 4 in particular such that the rear sides 1B, which for instance comprise the electrical contacts 1K of the component parts 1, face towards the auxiliary carrier 9. The front sides of the component parts 1 accordingly face away from the auxiliary carrier 9.

While FIG. 5A shows the carrier frame 3 and the component parts 1 in top view on the auxiliary carrier 9, FIG. 5B shows the component parts 1, the carrier frame 3 and the auxiliary carrier 9 in sectional view along the section line AB.

Figure 6A:
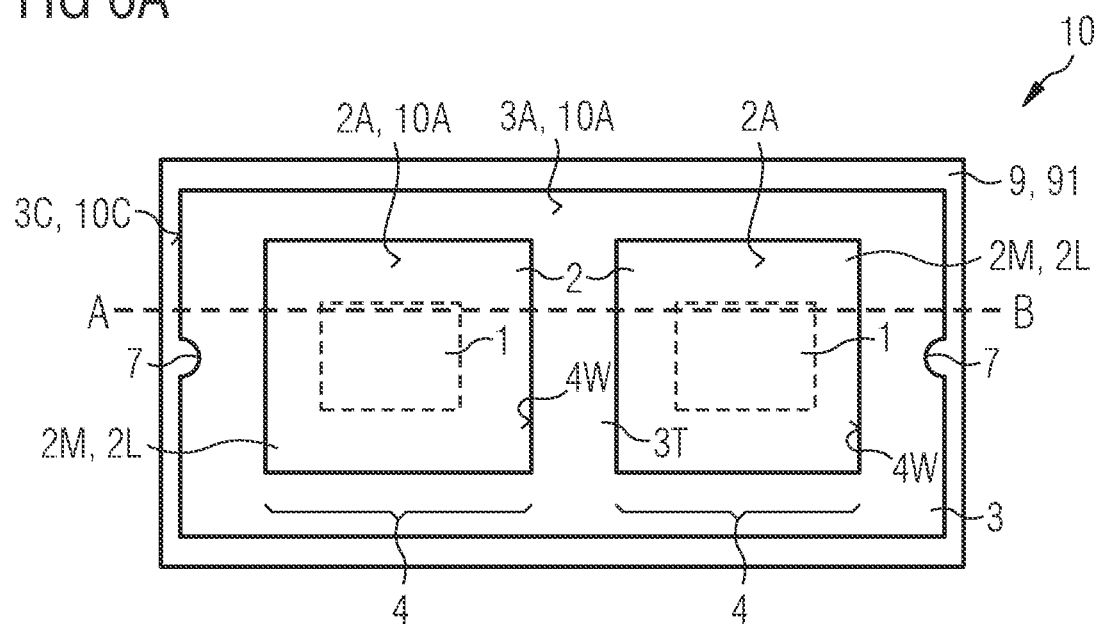
Figure 6B:
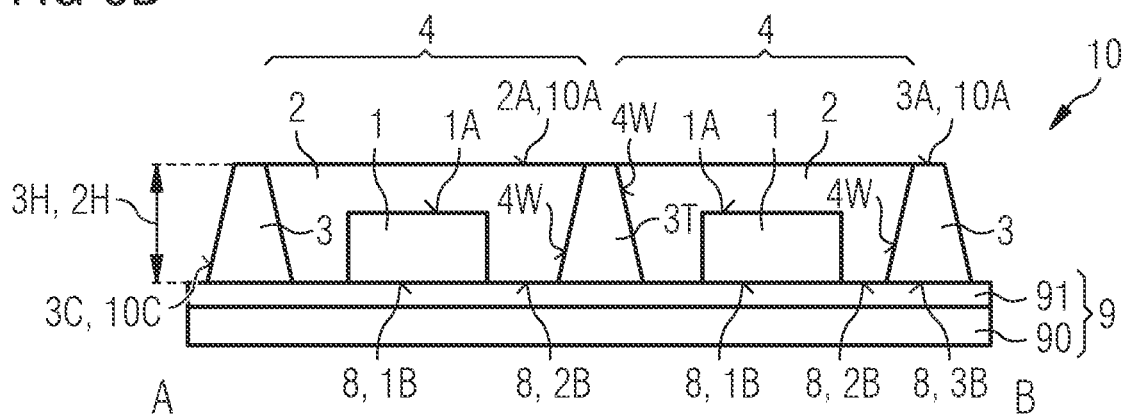

According to FIGS. 6A and 6B, the openings 4 are filled up, in particular completely filled up with the encapsulations 2. The encapsulations 2 are separated from each other, in particular by the separating walls 3T of the carrier frame 3. The encapsulations 2 in the openings 4 can have the same or different material compositions, in particular the same or different materials 2M and/or fluorescents 2L. As shown schematically in FIG. 6B, the encapsulations 2 and the carrier frame 3 can have for instance equal vertical heights 2H and 3H. If, within the manufacturing tolerances, the encapsulations 2 and the carrier frame 3 have equal vertical heights, the encapsulations 2 can be flush with the carrier frame 3 both on a front side 3A and on the rear side 3B of the carrier frame 3.

According to FIG. 6B, the component 10 has a contact surface 8. The contact surface 8 is formed mainly by the rear side 3B of the carrier frame 3, the rear sides 2B of the encapsulations 2 and/or the rear sides 1B of the component parts 1. In particular, the geometry of the contact surface 8 is determined by the geometry of one surface of the auxiliary carrier 9, in particular by a geometry of the adhesive layer 61. In particular, the contact surface 8 and/or the surface of the auxiliary carrier 9 are/is planar.

Figure 7A:
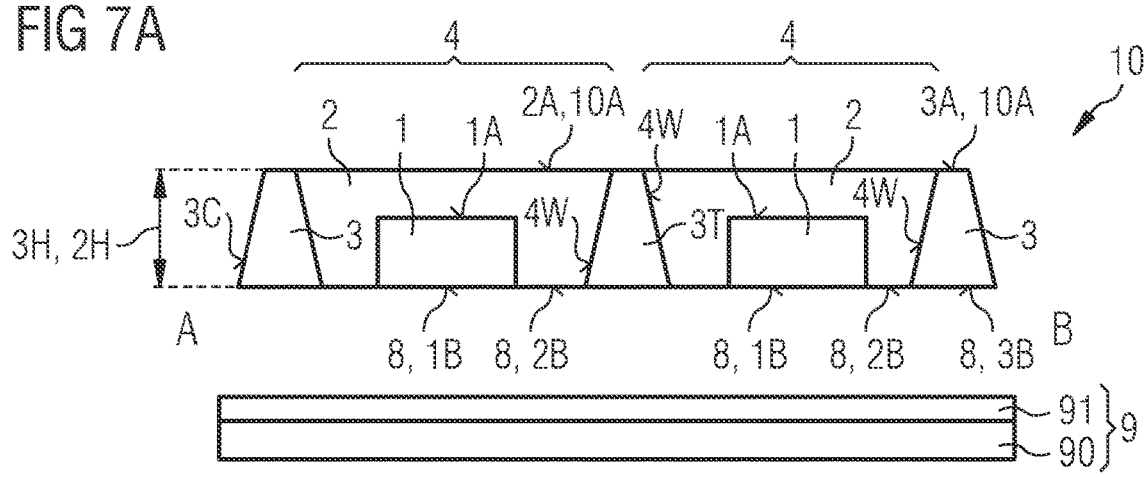

According to FIG. 7A, the auxiliary carrier 9 is removed from the carrier frame 3, from the encapsulations 2 and/or from the component parts 1. In particular, the adhesive layer 91 is a thermally dissolvable adhesive layer, especially a thermally dissolvable adhesive film. In this case, the auxiliary carrier 9 can be separated from the carrier frame 3, the encapsulations 4 and the component parts 1 by heating the adhesive layer 91. After removing the auxiliary carrier 9, the contact surface 8 is exposed. At the contact surface 8, the electrical contacts of the component parts 1 are in particular freely accessible.

Figure 7B:
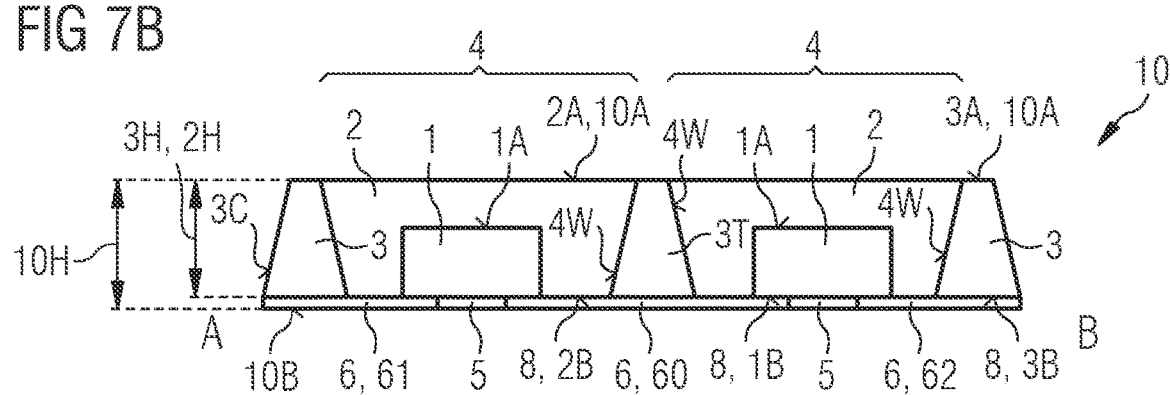

As shown in FIG. 7B, a contact structure 6 comprising a common connection area 60 and the individual connection areas 61 and 62 is formed in particular on contact connection area 8. The common connection area 60 is contiguous and, in a plane view of the rear side 10B of the component 10, partially covers at least two component parts 1. A protective layer 5, in particular a radiation-reflecting protective layer 5, can be applied to the exposed areas of the contact surface 8 which remain not-covered by the structured contact structure 6.

The rear side 10B of the component 10 is formed in particular in places by exposed surfaces of the contact structure 6 and in places by exposed surfaces of the protective layer 5. Along the vertical directions the component 10 is spatially delimited by the front side 10A and by the rear side 10B. The component 10 has an overall height which corresponds to the vertical height 10H between the front side 10A and the rear side 10B of the component 10.

Figure 7C:
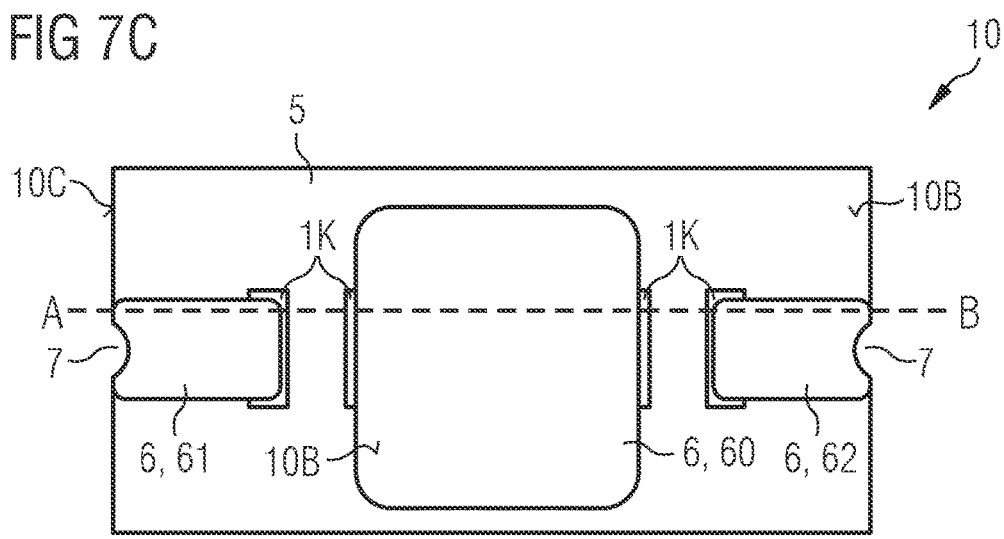

The exemplary embodiments of a component 10 shown in FIGS. 7B and 7C correspond to the exemplary embodiments of a component 10 shown in FIGS. 1B and 1C. The component 10 can be produced according to the method steps schematically shown in FIGS. 3A to 7B.

Figure 8:
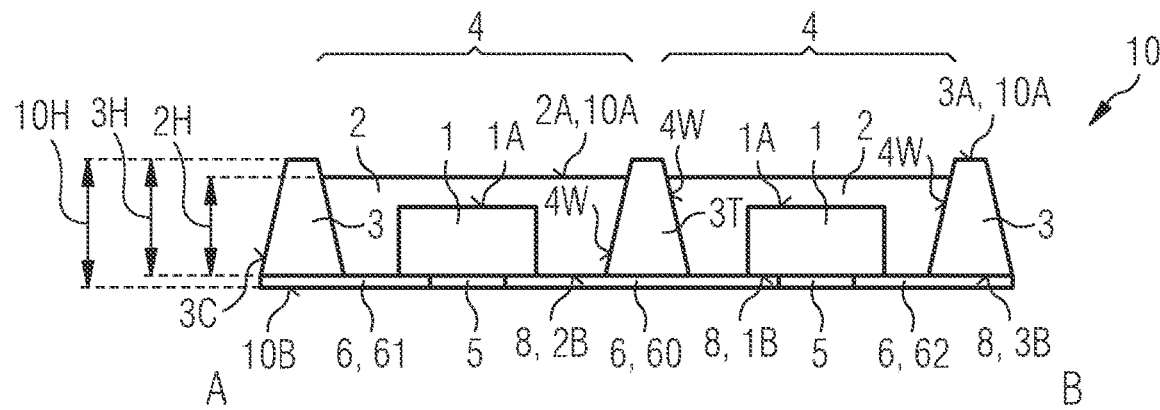
FIG. 8 shows schematic illustration of another exemplary embodiment of a component in schematic sectional view.

The exemplary embodiment shown in FIG. 8 is essentially the same as the exemplary embodiment of a component 10 shown in FIG. 1B. In contrast, the encapsulation 2 and the carrier frame 3 have different vertical heights 2H and 3H. As shown in FIG. 8, the opening 4 is only partially filled by the corresponding encapsulation 2. At the front side 10A of the component 10, the front side 3A of the carrier frame 3 is no longer flush with the front sides 2A of the encapsulations. The front side 10A of the component therefore has steps at the transitions between the carrier frame 3 and the encapsulations 2. At the contact surface 8, the encapsulations 2 can still be flush with the carrier frame 3. The vertical height of the encapsulation 2 is therefore lower than that of the carrier frame 3.

Figure 9:
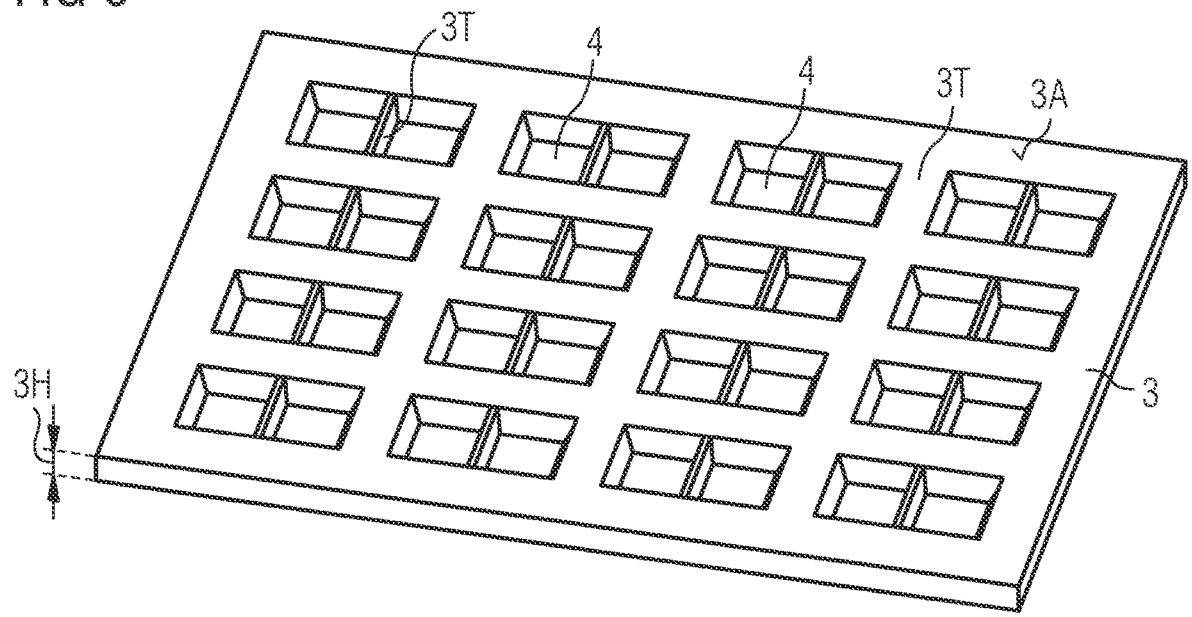
FIG. 9 shows schematic illustration of an exemplary embodiment of a carrier frame of the component.

FIG. 9 schematically shows another embodiment of the carrier frame 3. The carrier frame 3 can have more than two or more than four openings 4. In particular, the carrier frame 3 can have separating walls 3T of different widths. It is conceivable that a component 10, which has a carrier frame 3 as shown in FIG. 9, is separated into smaller components 10 in a subsequent method step. In this way a large number of the components 10 can be produced efficiently.

A component 10 described here can have any number of the component parts 1 and any number of openings 4. It is possible that the component parts 1, which are located in the openings 4, can be individually electrically contacted. By suitable control of the component parts 1, it can be achieved that the component 10 as a whole emits light with any desired color hue, e.g. warm white light or cold white light, and/or with any desired light intensity, especially any desired color intensity.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the claims or exemplary embodiments.

The invention claimed is:
1. A component comprising:
   at least two component parts configured to generate electromagnetic radiation;
   two encapsulations; and
   a one-piece carrier frame having a plurality of openings, each opening in form of a through-hole,
   wherein the component parts are arranged in different openings such that a respective component part is laterally spaced apart from inner walls of an associated opening,
   wherein each component part is enclosed in lateral directions by one of the encapsulations such that the component parts are mechanically connected to the carrier frame via the encapsulations thereby forming a self-supporting and mechanically stable unit,
wherein the carrier frame comprises a casting material, the casting material being a castable silicone, a resin or a plastic material,
wherein the component parts, the encapsulations and the carrier frame are flush with one another at a lateral contact surface, the lateral contact surface being formed in regions by a rear side of one of the component parts and/or one of the encapsulations and/or the carrier frame, and
wherein the component further comprises one of the following additional features i or ii, namely:
i) a contact structure for external electrical contacting of one of the component parts formed on the lateral contact surface, wherein the rear side of the component is formed in regions by an exposed surface of the contact structure and the component is electrically contactable exclusively via the rear side, and wherein the component and/or the carrier frame have/has a side surface having an indentation, the indentation being visible in a plan view of a front side of the component and/or of the carrier frame and being formed for marking a position of the contact structure on the rear side of the component;
ii) a radiation-reflecting protective layer on the lateral contact surface, wherein the rear side of the component is formed in regions by an exposed surface of the radiation-reflecting protective layer.

2. The component according to claim 1,
wherein the carrier frame is formed as a main carrier of the component stabilizing the component,
wherein the component is free of any further carrier on which the carrier frame or the component parts are arranged, and
wherein at least 90% of a vertical height of the component is accounted for by a vertical height of the carrier frame.

3. The component according to claim 1, wherein a ratio between a vertical height of the carrier frame and a vertical height of one of the encapsulations is between 0.8 and 1.2 inclusive.

4. The component according to claim 1, wherein one of the encapsulations and the carrier frame have the same vertical height.

5. The component according to claim 1, wherein the respective encapsulation comprises a radiation-transmissive material and completely covers the respective component part in the plan view of the front side of the component.

6. The component according to claim 1, wherein the encapsulation comprises a radiation-transmissive material with fluorescent particles embedded therein for light conversion.

7. The component according to claim 1,
wherein the component or the carrier frame has the side surface having the indentation, and
wherein the indentation is visible in the plan view of the front side of the component and is configured to mark a position of the contact structure on the rear side of the component.

8. The component according to claim 1, wherein side surfaces of the carrier frame are each formed obliquely so that from the front side of the component to the rear side of the component, an inner separating wall and outer separating walls of the carrier frame have an increasing cross section.

9. The component according to claim 1, wherein the two encapsulations comprise different fluorescent particles.

10. A method for producing a component, the method comprising:
providing an auxiliary carrier;
forming a carrier frame on the auxiliary carrier, the carrier frame having at least two openings each in form of a through-hole, wherein the carrier frame is formed directly on the auxiliary carrier by a casting process and the carrier frame is formed from a casting material which is a tastable silicone, resin or plastic material;
arranging at least two component parts in the openings on the auxiliary carrier such that the component parts are each laterally spaced apart from inner walls of an associated opening;
forming at least two encapsulations in the openings so that the component parts are each enclosed in lateral directions by an associated encapsulation such that the component parts are mechanically connected to the carrier frame via the encapsulations; and
removing the auxiliary carrier,
wherein the auxiliary carrier has a base body and a thermally dissolvable adhesive layer arranged on the base body,
wherein the component parts are adhered to the adhesive layer prior to forming of the encapsulation, and
wherein the auxiliary carrier is removed from the carrier frame by heating the adhesive layer after forming of the encapsulations.

11. The method according to claim 10,
wherein the carrier frame is formed as a main carrier of the component stabilizing the component,
wherein, after removing the auxiliary carrier, the component is free of any further carrier on which the carrier frame or the component parts are arranged, and
wherein at least 90% of a vertical height of the component is accounted for by a vertical height of the carrier frame.

12. The method according to claim 10, wherein a ratio between a vertical height of the carrier frame and a vertical height of one of the encapsulations is between 0.8 and 1.2 inclusive.

13. The method according to claim 10, wherein one of the encapsulations and the carrier frame have the same vertical height.

14. The method according to claim 10, wherein the component parts, the encapsulations and the carrier frame are flush with one another at a lateral contact surface, the lateral contact surface being formed in regions by a rear side of one of the component parts and/or one of the encapsulations and/or the carrier frame.

15. The method according to claim 10, wherein the respective encapsulation comprises a radiation-transmissive material and completely covers the respective component part in a plan view of a front side of the component.

16. The method according to claim 10, wherein the encapsulation comprises a radiation-transmissive material with fluorescent particles embedded therein for light conversion.

17. The method according to claim 10,
wherein the component or the carrier frame has a side surface having an indentation, and
wherein the indentation is visible in a plan view of a front side of the component and is configured to mark a position of a contact structure on a rear side of the component.

18. The method according to claim 10, wherein the two encapsulations comprise different fluorescent particles.

19. The method according to claim 10, wherein the component comprises a radiation-reflecting protective layer on a lateral contact surface, and wherein a rear side of the component is formed in regions by an exposed surface of the radiation-reflecting protective layer.

20. A component comprising:
- at least two component parts configured to generate electromagnetic radiation;
- two encapsulations; and
- a one-piece carrier frame having a plurality of openings each in form of a through-hole,
- wherein the component parts are arranged in different openings such that the respective component part is laterally spaced apart from inner walls of an associated opening,
- wherein the component parts are each enclosed in lateral directions by one of the encapsulations such that the component parts are mechanically connected to the carrier frame via the encapsulations thereby forming a self-supporting and mechanically stable unit,
- wherein the carrier frame is formed from a casting material, the casting material being a castable silicone, a resin or a plastic material,
- wherein the component or the carrier frame has a side surface having an indentation, and
- wherein the indentation is visible in a plan view of a front side of the component and is configured to mark a position of a contact structure on a rear side of the component.

* * * * *